United States Patent
Chen et al.

(10) Patent No.: US 10,373,923 B2
(45) Date of Patent: Aug. 6, 2019

(54) PACKAGE WITH PASSIVE DEVICES AND METHOD OF FORMING THE SAME

(71) Applicant: Taiwan Semiconductor Manufacturing Company, Ltd., Hsinchu (TW)

(72) Inventors: Shuo-Mao Chen, New Taipei (TW); Der-Chyang Yeh, Hsinchu (TW); Li-Hsien Huang, Puzi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/823,110

(22) Filed: Nov. 27, 2017

(65) Prior Publication Data

US 2018/0082966 A1 Mar. 22, 2018

Related U.S. Application Data

(60) Continuation of application No. 14/302,091, filed on Jun. 11, 2014, now Pat. No. 9,831,200, which is a (Continued)

(51) Int. Cl.
*H01L 23/00* (2006.01)
*H01L 23/31* (2006.01)
(Continued)

(52) U.S. Cl.
CPC ............ *H01L 24/11* (2013.01); *H01L 21/56* (2013.01); *H01L 21/568* (2013.01); *H01L 21/76801* (2013.01); *H01L 23/3192* (2013.01); *H01L 23/525* (2013.01); *H01L 23/5223* (2013.01); *H01L 23/5227* (2013.01); *H01L 23/5228* (2013.01); *H01L 23/5389* (2013.01); *H01L 23/3107* (2013.01); *H01L 23/3135* (2013.01); *H01L 2924/0002* (2013.01); (Continued)

(58) Field of Classification Search
CPC ... H01L 24/11; H01L 21/56; H01L 21/76801; H01L 23/5389; H01L 23/3192; H01L 23/5223; H01L 23/5227; H01L 23/5228; H01L 23/525; H01L 21/568; H01L 2924/12042; H01L 2924/181; H01L 2924/15787
USPC .......................................................... 438/126
See application file for complete search history.

(56) References Cited

U.S. PATENT DOCUMENTS 5,874,770 A 2/1999 Saia
6,400,036 B1 6/2002 Tang et al.
(Continued)

FOREIGN PATENT DOCUMENTS

TW 200926322 6/2009
TW 200929407 7/2009
(Continued)

*Primary Examiner* — Bo Fan
(74) *Attorney, Agent, or Firm* — Slater Matsil, LLP

(57) ABSTRACT

An embodiment is a device comprising a substrate, a metal pad over the substrate, and a passivation layer comprising a portion over the metal pad. The device further comprises a metal pillar over and electrically coupled to the metal pad, and a passive device comprising a first portion at a same level as the metal pillar, wherein the first portion of the passive device is formed of a same material as the metal pillar.

19 Claims, 14 Drawing Sheets

Related U.S. Application Data division of application No. 13/539,149, filed on Jun. 29, 2012, now Pat. No. 8,809,996.

(51) Int. Cl.
  *H01L 23/522* (2006.01)
  *H01L 23/525* (2006.01)
  *H01L 21/56* (2006.01)
  *H01L 23/538* (2006.01)
  *H01L 21/768* (2006.01)

(52) U.S. Cl.
  CPC ............... *H01L 2924/12042* (2013.01); *H01L 2924/15787* (2013.01); *H01L 2924/181* (2013.01)

(56) References Cited

U.S. PATENT DOCUMENTS

| | | | |
|---|---|---|---|
| 6,410,960 | B1 | 6/2002 | Arai |
| 6,534,374 | B2 | 3/2003 | Johnson |
| 6,551,863 | B2 | 4/2003 | Johnson et al. |
| 6,781,229 | B1 | 8/2004 | Fazelpour |
| 6,878,633 | B2 | 4/2005 | Raskin |
| 7,446,388 | B2 | 11/2008 | Casper |
| 7,619,297 | B2 | 11/2009 | Wang |
| 7,858,441 | B2 | 12/2010 | Lin |
| 7,919,868 | B2 | 4/2011 | Hedler et al. |
| 8,084,859 | B2 | 12/2011 | Tetani |
| 8,680,647 | B2 | 3/2014 | Yu et al. |
| 8,809,996 | B2 | 8/2014 | Chen et al. |
| 2002/0028533 | A1 | 3/2002 | Tang et al. |
| 2003/0045027 | A1 | 3/2003 | Johnson et al. |
| 2005/0104177 | A1* | 5/2005 | Lin ............ H01L 23/5286 257/678 |
| 2007/0267718 | A1 | 11/2007 | Lee |
| 2008/0153245 | A1 | 6/2008 | Lin et al. |
| 2008/0237879 | A1* | 10/2008 | Yang ............ H01L 23/5389 257/774 |
| 2009/0045512 | A1 | 2/2009 | Hedler et al. |
| 2009/0072388 | A1 | 3/2009 | Tews |
| 2009/0140421 | A1 | 6/2009 | Yaojian et al. |
| 2009/0155959 | A1 | 6/2009 | Lin et al. |
| 2010/0006994 | A1 | 1/2010 | Shim et al. |
| 2010/0237495 | A1* | 9/2010 | Pagaila ............ H01L 21/568 257/700 |
| 2011/0204509 | A1 | 8/2011 | Lin |
| 2011/0278736 | A1 | 11/2011 | Lin et al. |
| 2012/0061823 | A1 | 3/2012 | Wu et al. |
| 2012/0133379 | A1 | 5/2012 | Chou et al. |
| 2012/0153472 | A1 | 6/2012 | Pagaila et al. |
| 2013/0168805 | A1 | 7/2013 | Yu et al. |
| 2014/0001635 | A1 | 1/2014 | Chen et al. |
| 2014/0073091 | A1 | 3/2014 | Yu et al. |

FOREIGN PATENT DOCUMENTS

| | | |
|---|---|---|
| TW | 201123327 A1 | 7/2011 |
| TW | 201041058 A1 | 11/2011 |

\* cited by examiner

PACKAGE WITH PASSIVE DEVICES AND METHOD OF FORMING THE SAME

CROSS-REFERENCE TO RELATED APPLICATIONS

This application is a continuation of U.S. patent Ser. No. 14/302,091, filed on Jun. 11, 2014 and titled "Package with Passive Devices and Method of Forming the Same," which is a divisional of U.S. patent Ser. No. 13/539,149, filed on Jun. 29, 2012 (now U.S. Pat. No. 8,809,996, issued Aug. 19, 2014) and titled "Package with Passive Devices and Method of Forming the Same," which applications are incorporated herein by reference.

BACKGROUND

With the evolving of semiconductor technologies, semiconductor dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly with time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a high throughput and a low cost. Further, less underfill or molding compound is needed. This packaging technology, however, also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means that the I/O pads on a die can be redistributed to a greater area than the die, and hence the number of I/O pads packed on the surfaces of the dies can be increased.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
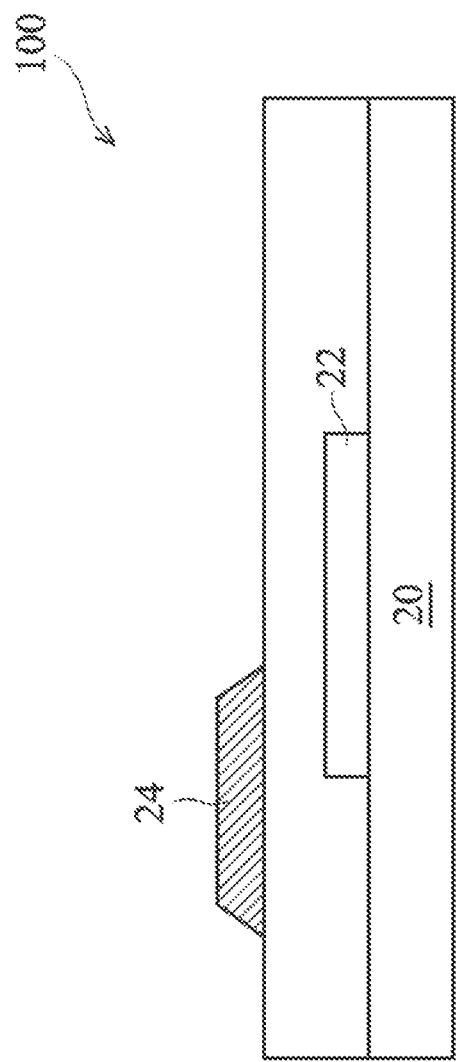
FIGS. 1 through 10 are cross-sectional views of intermediate stages in the manufacturing of a package in accordance with various exemplary embodiments.

Various steps in the manufacturing of a package structure including integrated passive devices (IPD) will be described with reference to FIGS. 1 through 10. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a package structure including IPDs. Other embodiments may also be applied, for example, to package structures where additional shielding layers are desired.

With reference now to FIG. 1, there is shown a die 100 at an intermediate stage of processing including a substrate 20 and a bond pad 24. The substrate 20 may be silicon, silicon germanium, silicon carbide, a ceramic substrate, a quartz substrate, the like, or a combination thereof. The substrate 20 may comprise bulk silicon, doped or undoped, or an active layer of a silicon-on-insulator (SOI) substrate. Other substrates that may be used include multi-layered substrates, gradient substrates, or hybrid orientation substrates.

The substrate 20 may include integrated circuit devices 22. As one of ordinary skill in the art will recognize, a wide variety of integrated circuit devices 22 such as transistors, capacitors, resistors, combinations of these, or the like may be used to generate the structural and functional requirements of the design for the die 100. The integrated circuit devices 22 may be formed using any suitable methods.

The substrate 20 may also include an interconnect structure (not shown). The interconnect structure may be formed over the integrated circuit devices 22 and are designed to connect the various integrated circuit devices 22 to form functional circuitry. The interconnect structure may be formed of alternating layers of dielectric (e.g., low-k dielectric material) and conductive material (e.g., copper) and may be formed through any suitable process (such as deposition, damascene, dual damascene, etc.). The conductive and dielectric layers may include metal lines and vias (not shown) to electrically couple the integrated circuit devices 22 to the bond pad 24. Only a portion of the substrate 20 is illustrated in the figures, as this is sufficient to fully describe the illustrative embodiments.

The bond pad 24 may be formed over and in electrical contact with the interconnect structure (not shown) in order to help provide external connections to the integrated circuit devices. The bond pad 24 may comprise aluminum, copper, nickel, the like, or a combination thereof. The bond pad 24 may be formed using a deposition process, such as sputtering, to form a layer of material (not shown). Portions of the layer of material may then be removed through a suitable process, such as photolithographic masking and etching, to form the bond pad 24. However, any other suitable process may be utilized to form the bond pad 24. The bond pad 24 may be formed to have a thickness of between about 0.5 µm and about 4 µm.

Figure 2:
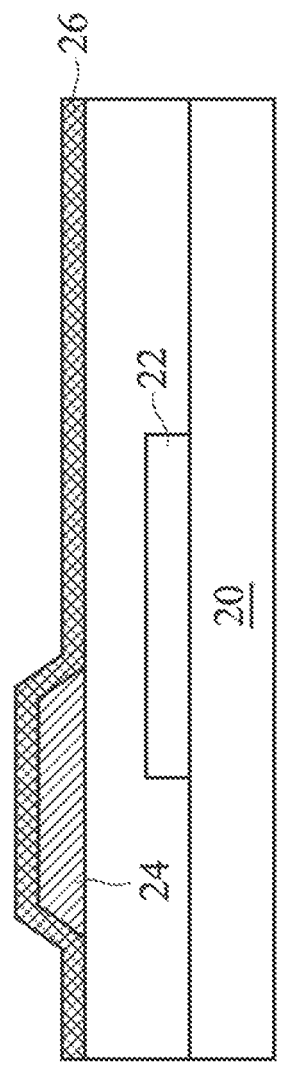

A first passivation layer 26 may be formed on the substrate 20 and over the bond pad 24 as illustrated in FIG. 2. The first passivation layer 26 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The first passivation layer 26 may be formed through a process such as chemical vapor deposition (CVD), although any suitable process may be utilized, and may have a thickness between about 0.5 µm and about 5 µm. In some embodiments, a top surface of bond pad 24 is substantially level with a portion of bottom surface of the first passivation layer 26.

Figure 3:
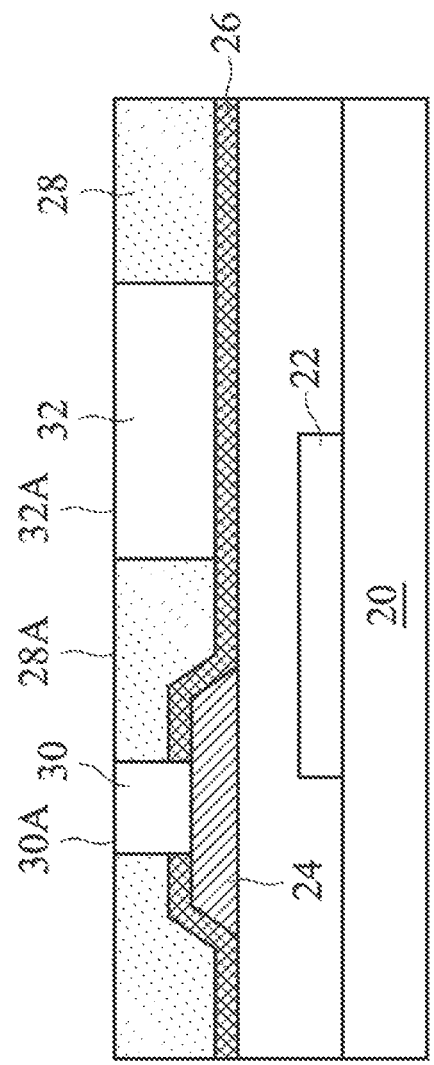

FIG. 3 illustrates the formation of a second passivation layer 28 over the first passivation layer 26, a first metal pillar 30 in the first and second passivation layers 26 and 28 and electrically coupled to the bond pad 24, and a second metal pillar 32 in the first and second passivation layers 26 and 28. Throughout the description, the second metal pillar 32 may be alternatively referred to as a metal pillar redistribution line (RDL) 32.

The second passivation layer 28 may be formed over the first passivation layer 26. The second passivation layer 28 may be formed from a polymer such as polyimide. Alternatively, the second passivation layer 28 may be formed of a material similar to the material used as the first passivation layer 26, such as silicon oxides, silicon nitrides, low-k dielectrics, extremely low-k dielectrics, BCB, PBO, the like, or a combination thereof. The second passivation layer 28 may be formed to have a thickness between about 2 µm and about 15 µm.

After the second passivation layer 28 has been formed, the first metal pillar 30 may be formed over the bond pad 24 in order to allow for physical and electrical contact to the bond pad 24 through the first and second passivation layers 26 and 28. At a same time and with a same process as the formation of the first metal pillar 30, the metal pillar RDL 32 may be formed over the first passivation layer 26 in order to form and/or couple portions of the subsequently formed integrated passive device (IPD) 200 (discussed further below).

The first metal pillar 30 and the metal pillar RDL 32 may be formed by forming openings in the substrate first and second passivation layers 26 and 28 by, for example, etching, milling, laser techniques, combinations of these, or the like. A thin barrier layer (not shown) may be conformally deposited on the second passivation layer 28 and in the openings, such as by CVD, atomic layer deposition (ALD), the like, or a combination thereof. The barrier layer may comprise a nitride or an oxynitride, such as titanium nitride, titanium oxynitride, tantalum nitride, tantalum oxynitride, tungsten nitride, silicon dioxide, the like, or a combination thereof. A conductive material may be deposited over the thin barrier layer and in the openings. The conductive material may be formed by an electro-chemical plating process, CVD, ALD, physical vapor deposition (PVD), the like, or a combination thereof. The conductive material may be copper, tungsten, aluminum, silver, gold, the like, or a combination thereof. The conductive material may then be patterned to form the first metal pillar 30 and the metal pillar RDL 32.

In an embodiment, a top surface 30A of the first metal pillar 30 may be substantially level with a top surface 28A of the second passivation layer 28 and a top surface 32A of the metal pillar RDL 32. In another embodiment, the top surface 30A of the first metal pillar 30 and/or the top surface 32A of the metal pillar RDL 32 may be lower than the top surface 28A of the second passivation layer 28 with a thin portion of the second passivation layer 28 covering the first metal pillar 30 and/or the metal pillar RDL 32.

Figure 4:
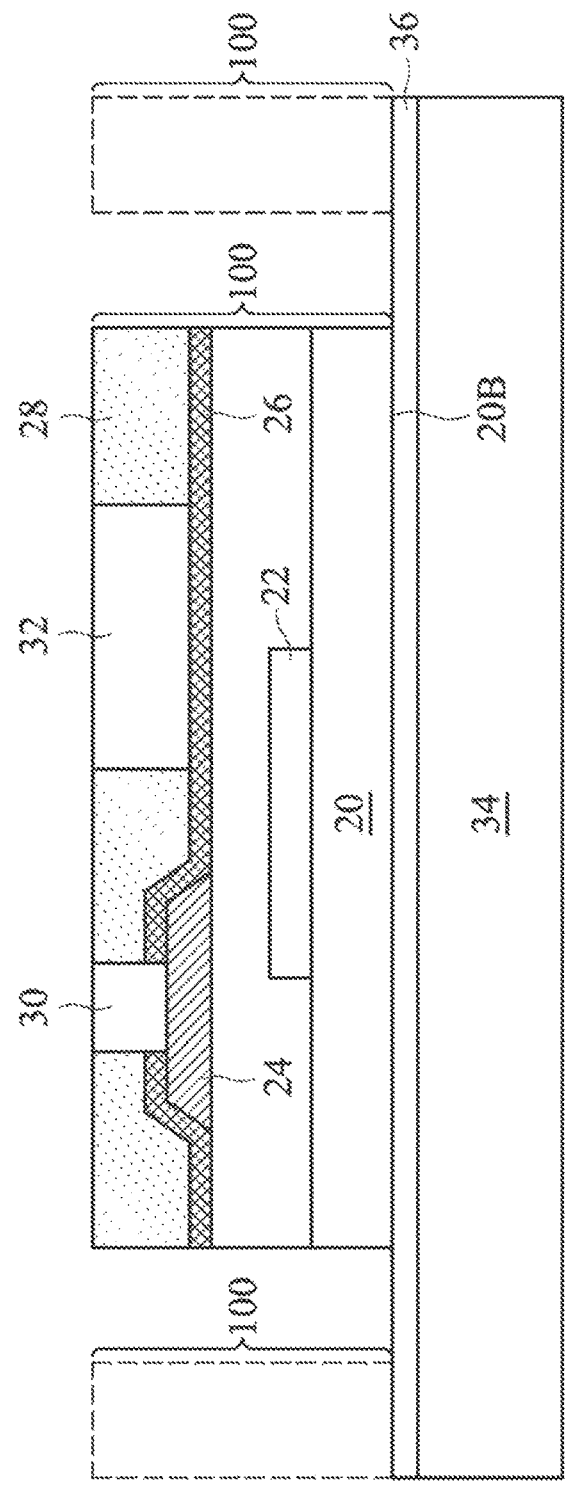

FIG. 4 illustrates the mounting of die 100 on a carrier substrate 34. The carrier substrate 34 may provide temporary mechanical and structural support during the subsequent processing steps. The die 100 may be mounted to the carrier substrate 34 using an adhesive layer 36. Although a single die 100 is illustrated, there may be a plurality of dies 100 identical to each other placed on the carrier substrate 34. In the embodiments wherein die 100 includes the substrate 20, a bottom surface 20B of substrate 20 contacts the adhesive layer 36. In some embodiments, spaces are left between neighboring dies 100. In an embodiment, the carrier substrate 34 may comprise glass, silicon oxide, aluminum oxide, the like, or a combination thereof. The adhesive layer 36 may be any suitable adhesive, such as ultraviolet (UV) glue, which loses its adhesive property when exposed to UV light.

Figure 5:
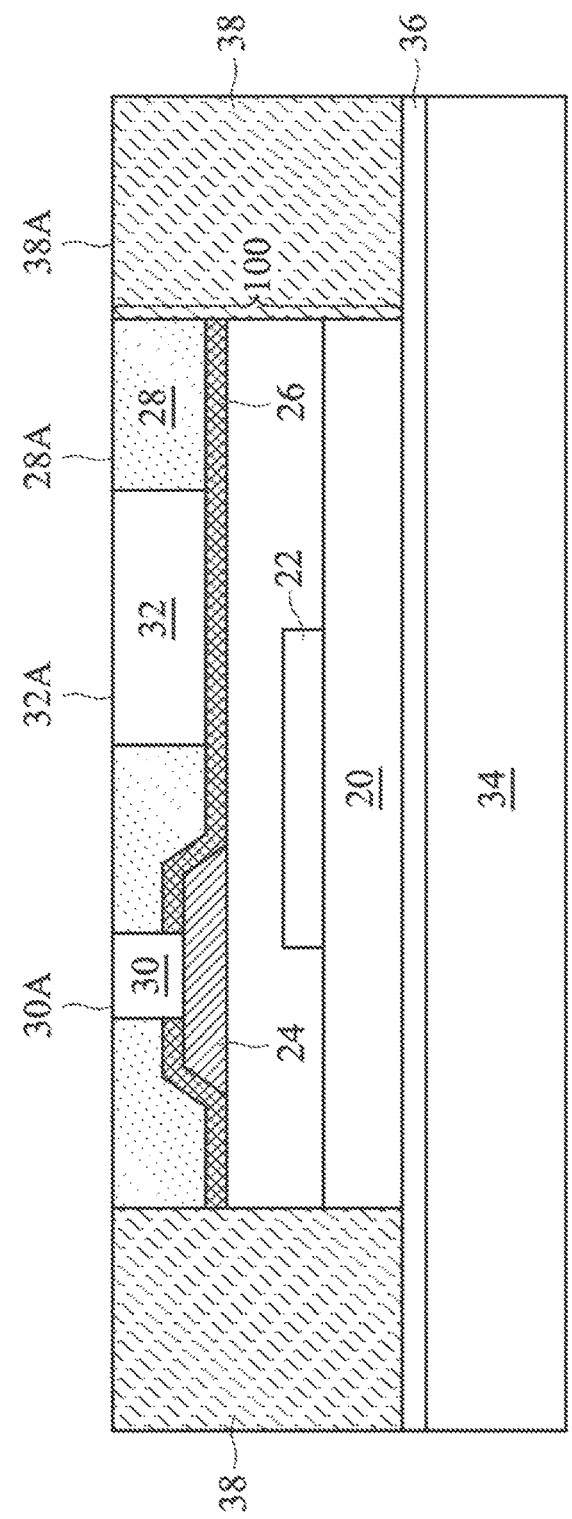

FIG. 5 illustrates the molding of polymer 38 on die 100. Polymer 38 may be a molding compound, and hence is referred to as molding compound 38 hereinafter, although it may also be formed of other materials. Molding compound 38 may comprise an organic material such as an epoxy, which is filled into the spaces between dies 100. The top surface of die 100 may also be covered by molding compound 38. A curing process may be performed to solidify molding compound 38.

As also shown in FIG. 5, a planarization, such as a grinding, may be performed on molding compound 38 until the first metal pillar 30 and the metal pillar RDL 32, and possibly the second passivation layer 28, are exposed. Accordingly, the top surface 28A of the second passivation layer 28, the top surface 30A of the first metal pillar 30, the top surface 32A of the metal pillar RDL 32, and the top surface 38A of the molding compound 38 may be substantially level with each other. In the embodiments wherein the first metal pillar 30 and/or the metal pillar RDL 32 are embedded in the second passivation layer 28, a layer of the second passivation layer 28 may also be grinded. As a result of the grinding, there may not be molding compound 38 over die 100. In a top view of the structure in FIG. 5, the die 100 is encircled by the molding compound 38.

Figure 6:
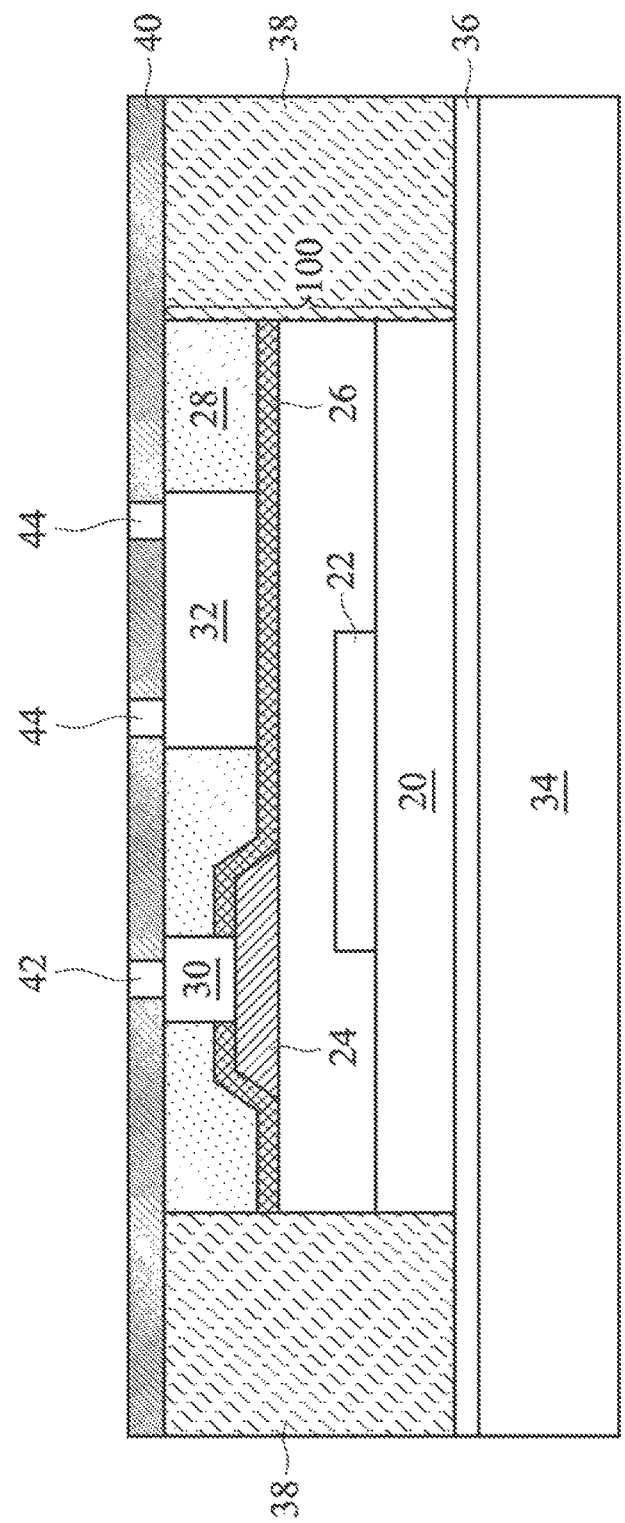

FIG. 6 illustrates the formation of a dielectric layer 40 over the molding compound 38, the second passivation layer 28, the first metal pillar 30, and the metal pillar RDL 32. The dielectric layer 40 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, PBO, BCB, the like, or a combination thereof. The dielectric layer 40 may be formed through a process such as chemical vapor deposition (CVD), although any suitable process may be utilized.

After the dielectric layer 40 is formed, openings 42 and 44 may be formed through the dielectric layer 40. Opening 42 may be formed in the dielectric layer 40 to expose a portion of the first metal pillar 30. The openings 42 and 44 may be formed, for example, by etching, milling, laser techniques, combinations of these, or the like. Openings 44 may be formed to expose one or more portions of the metal pillar RDL 32. In some embodiments, openings 44 may be formed simultaneously with opening 42.

Figure 7:
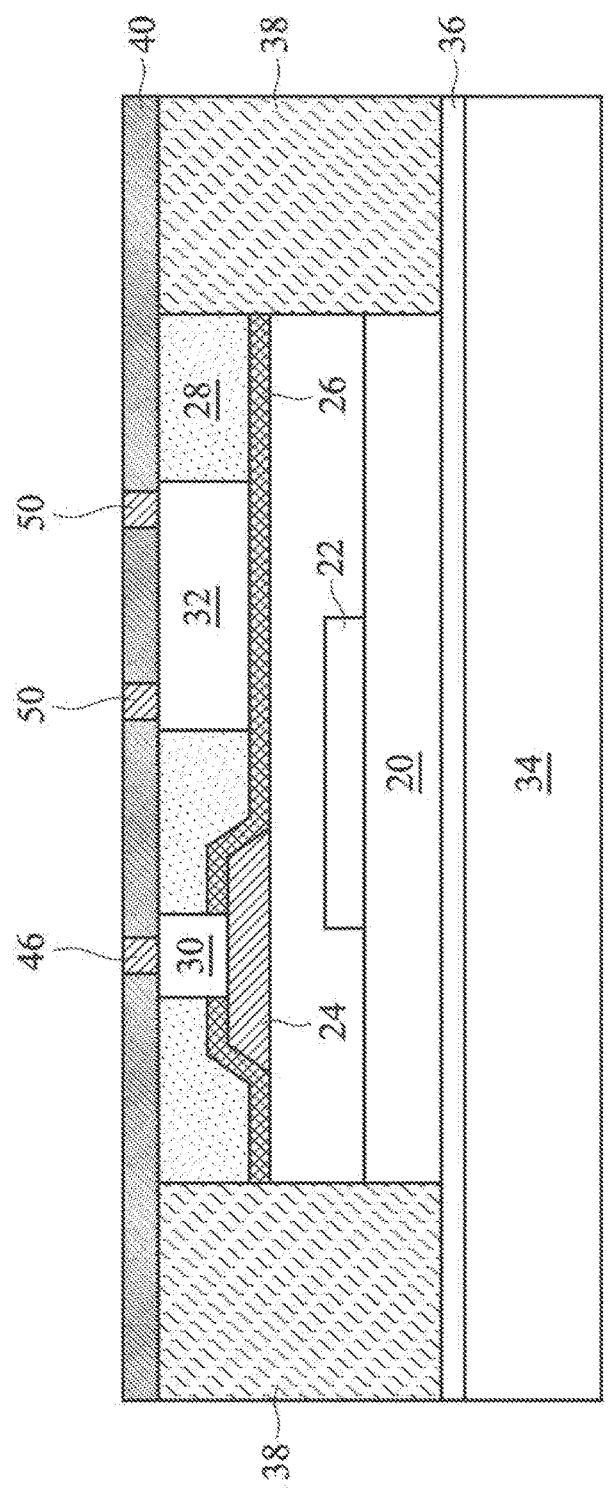

FIG. 7 illustrates the formation of via 46 in the opening 42 and vias 50 in the openings 44. The via 46 may provide electrical connection between the first metal pillar 30 and the subsequently formed post-passivation interconnect (PPI) 48 (see FIG. 8), and the vias 50 may provide electrical connections between the metal pillar RDL 32, the PPI 48 and the PPI features 52 (see FIG. 8). In an embodiment, the vias 46 and 50 may comprise copper, tungsten, aluminum, silver, gold, the like, or a combination thereof. In some embodiments, the vias 46 and 50 may include a barrier layer as discussed above in reference to the first metal pillar 30 and the metal pillar RDL 32. Other embodiments contemplate more than two vias 50 and more than one via 46.

Figure 8:
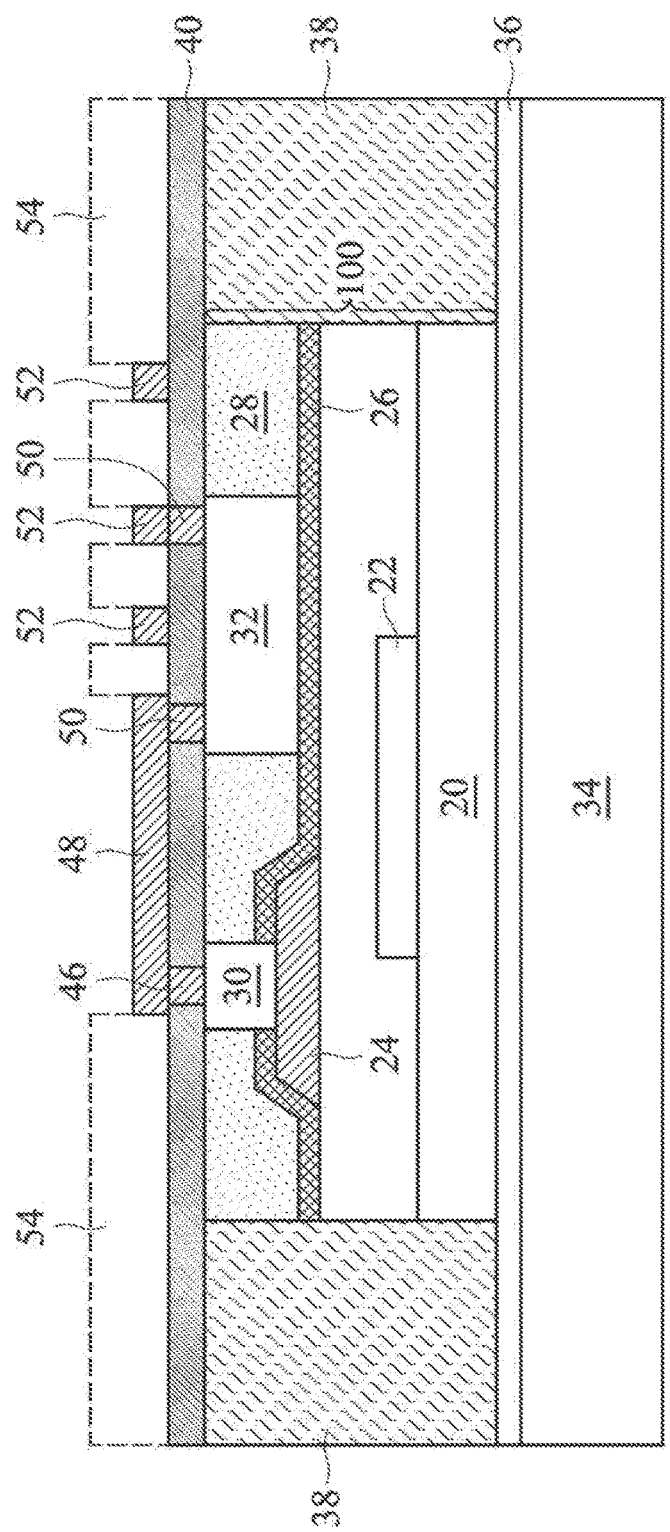

FIG. 8 illustrates the formation of PPI 48 and PPI features 52 over and in electrical connection with vias 46 and 50, respectively. In an embodiment, the PPI 48 and the PPI features 52 may comprise similar materials as the vias 46 and 50, such as, copper, tungsten, aluminum, silver, gold, the like, or a combination thereof, although they need not be formed of the same material. The PPI 48 and the PPI features 52 may be formed by forming and patterning a photo resist layer 54, and then forming PPI 48 and PPI features 52 by an electro-chemical plating process, CVD, ALD, PVD, the like, or a combination thereof.

Figure 9:
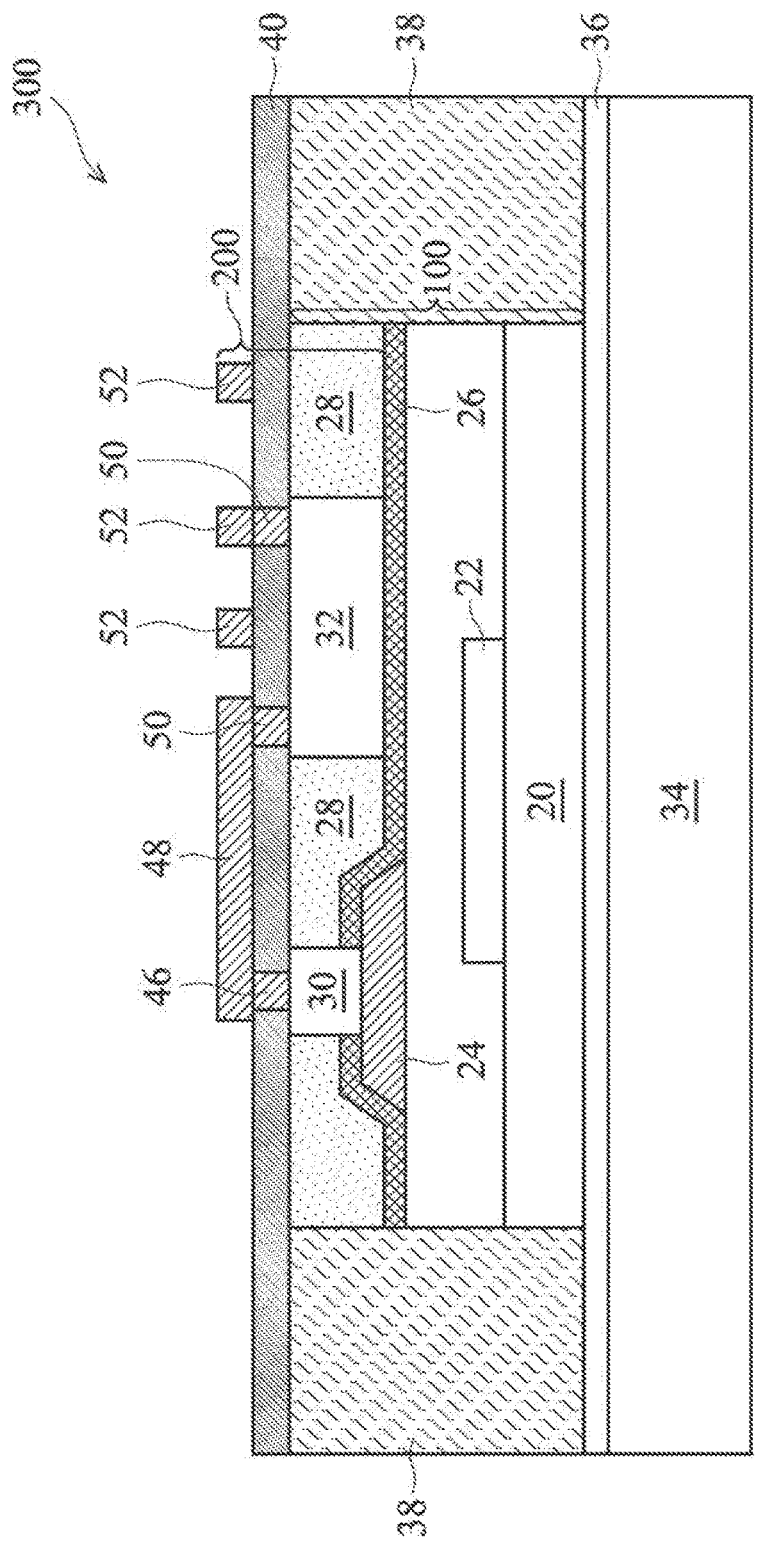

After the removal of the photo resist layer 54, an exemplary package 300 comprising an IPD 200 and a die 100 is illustrated in FIG. 9. The metal pillar RDL 32, the vias 50, and the PPI features 52 may form an IPD 200, which may be a resistor, a capacitor, an inductor, a transformer, a balun, a strip-line, a co-planar waveguide, or the like. The IPD 200 may be over and aligned to the die 100, as illustrated in FIG. 9. In another embodiment, the IPD 200 may be over and aligned to both the die 100 and the molding compound 38 as shown by the dotted rectangles 52 in FIG. 10. Other embodiments contemplate wherein there are two or more metal pillar RDLs 32, such as FIGS. 11A and 11B.

Figure 10:
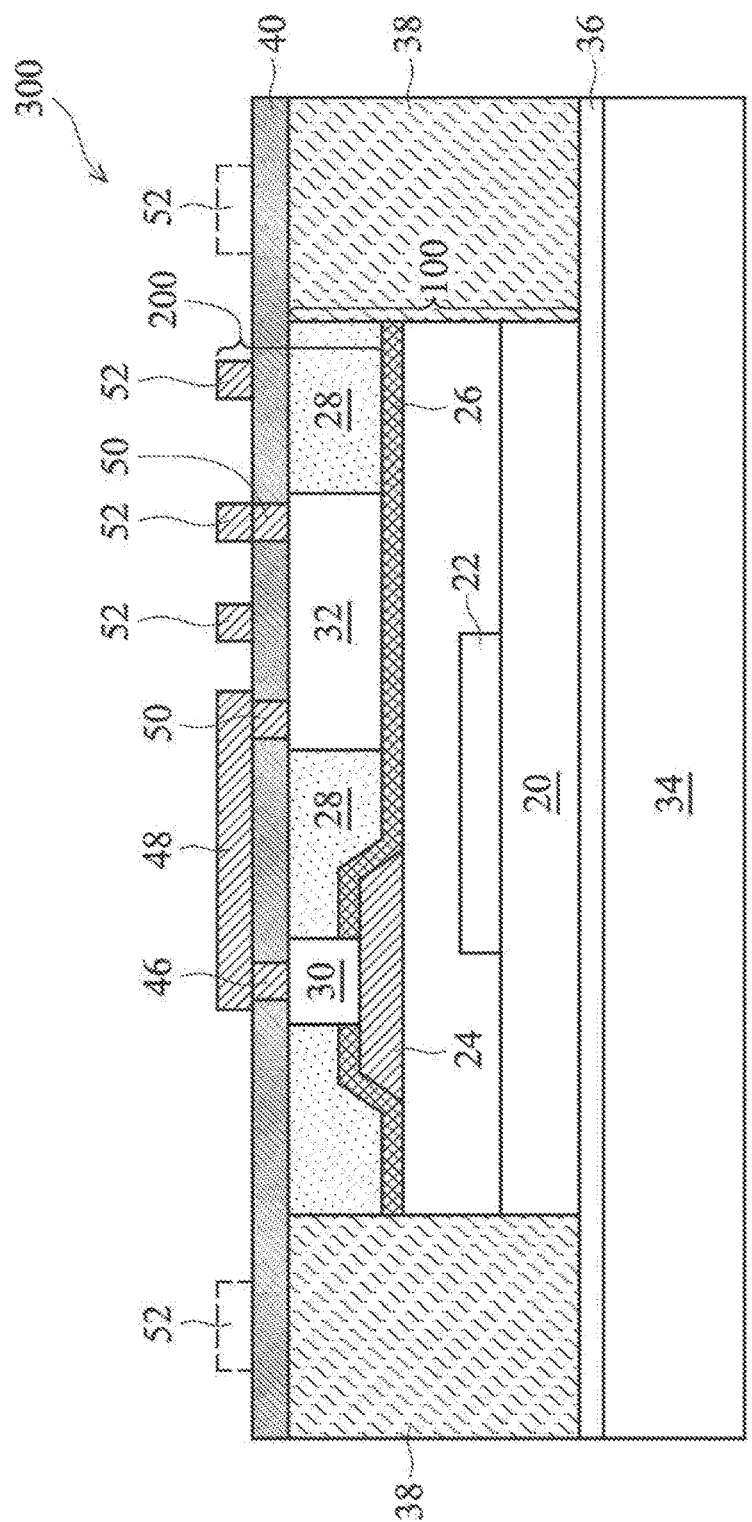

FIGS. 11A through 15B illustrate some of the exemplary IPDs 200 as in FIGS. 9 and 10. The formation methods of the IPDs 200 in FIGS. 11A through 15B may be found by referring to FIGS. 1 through 10. In each of the IPDs 200, there may be an upper conductive layer comprising PPI 48 and PPI features 52, a via 46, and a lower conductive layer comprising one or more metal pillar RDLs 32. Some of the IPDs 200 may also include one or more vias 50 in the same layer as the via 46.

Figure 11B:
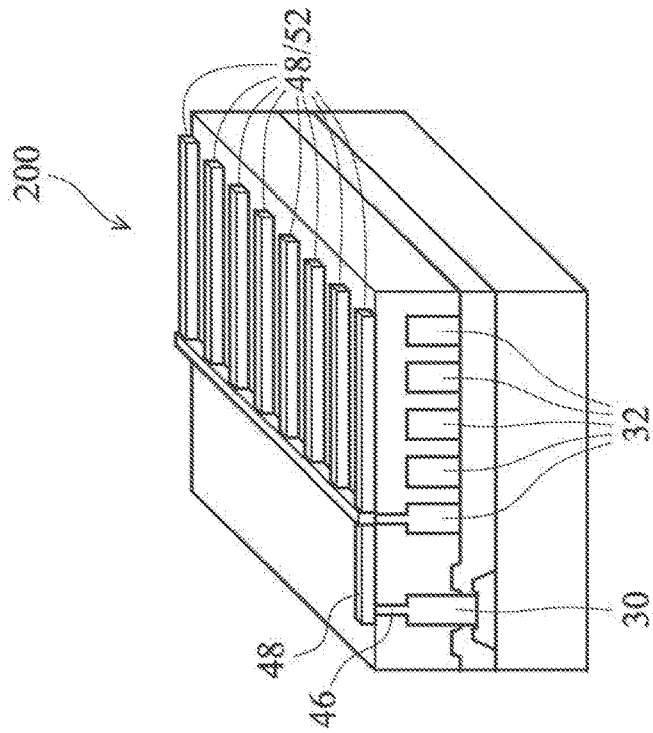
FIGS. 11A through 15B illustrate exemplary integrated passive devices (IPDs) according to embodiments.
Figure 11A:
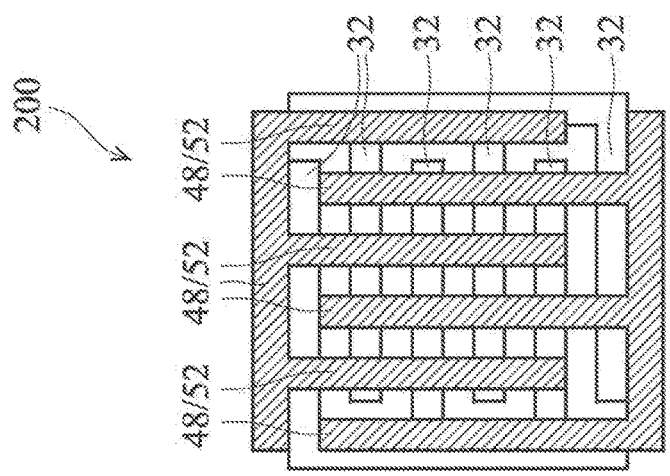

FIG. 11A illustrates a top view of an IPD 200, which is a metal-oxide-metal (MOM) capacitor. The IPD 200 includes a first plurality of capacitor fingers 48/52 (the upper layer) interconnected to form one capacitor plate of the capacitor, and a second plurality of capacitor fingers 32 (the lower layer) interconnected to form another capacitor plate of the capacitor. FIG. 11B illustrates a perspective view of the IPD 200. The first plurality of capacitor fingers 48/52 and the second plurality of capacitor fingers 32 may be spaced apart from each other by portions of dielectric layer 40 (not shown in FIGS. 11A and 11B, please refer to FIGS. 9 and 10), which forms parts of the capacitor insulator.

Figure 12B:
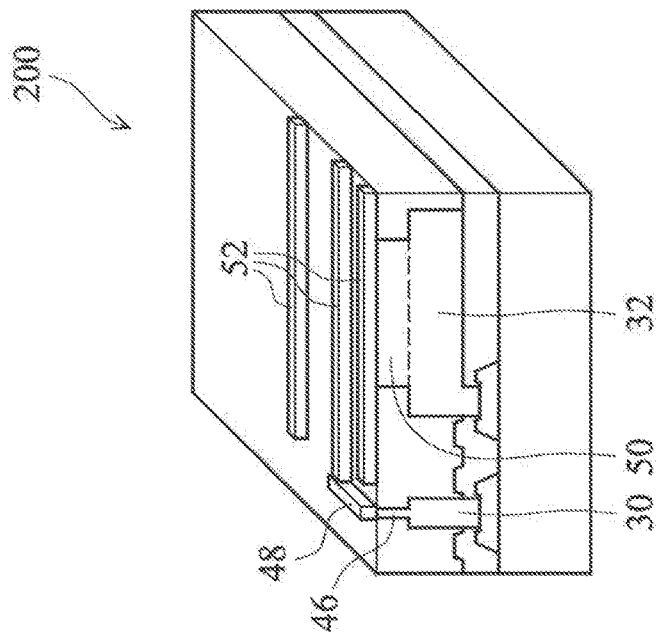
Figure 12A:
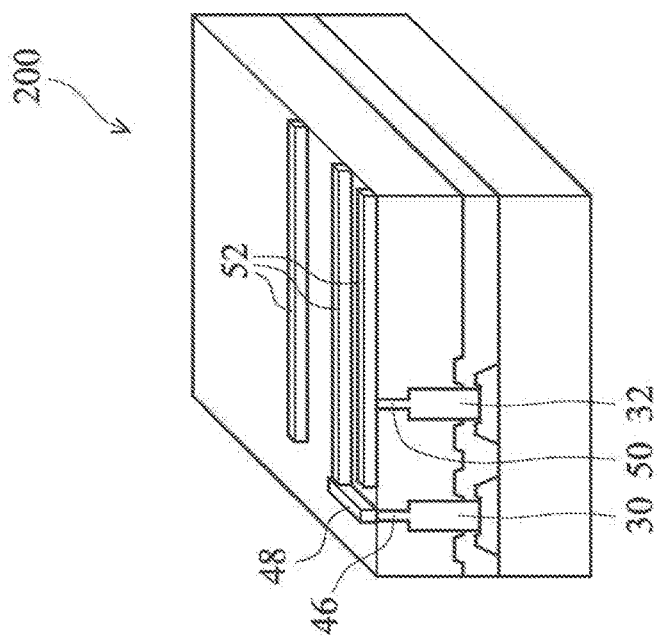

FIGS. 12A and 12B illustrate perspective views of an IPD 200, which are co-planar waveguides, according to embodiments. In FIG. 12A, the IPD 200 includes a signal line (center PPI feature 52) and ground lines (outer PPI features 52) on opposite sides of, and parallel to, the signal line. In FIG. 12B, the signal lines and the ground lines may each include a lower portion 32, a middle portion 50, and an upper portion 52 which are stacked to form a thick line. The stacking of 32, 50, and 52 may reduce the resistance of the lines and, thus, may improve the performance of the co-planar waveguide 200 in FIG. 12B.

Figure 13:
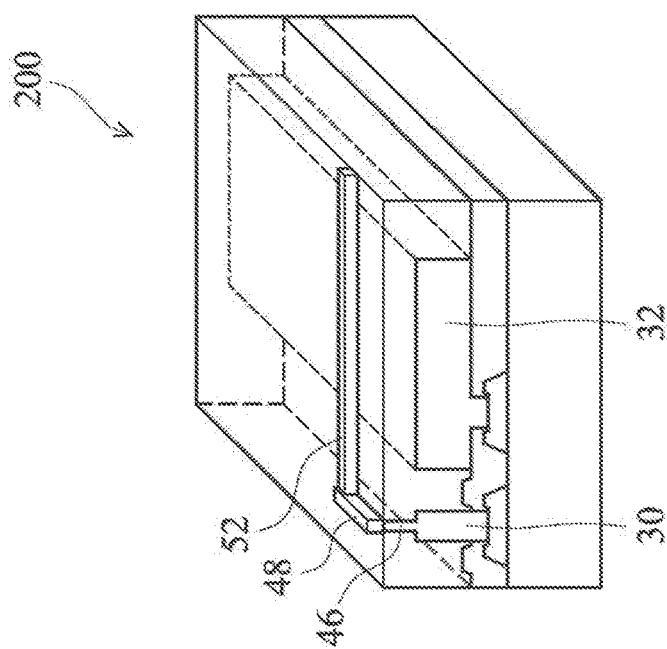
Figure 14:
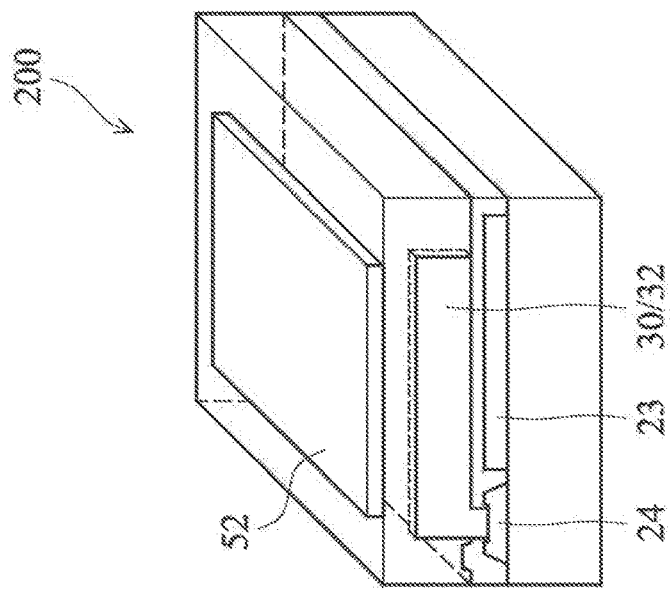

FIG. 13 illustrates view of an IPD 200, which is a micro-strip line comprising a metal pillar RDL 32 acting as a ground plane and a PPI feature 52 acting as the signal line. The signal line and the ground plane may be separated by a portion of the dielectric layer 40 (see FIGS. 9 and 10). FIG. 14 illustrates a perspective view of an IPD 200, which is a strip line comprising a bond pad 23 and a PPI feature 52 acting as ground planes and a metal pillar RDL 32 and a first metal pillar 30 acting as the signal line. In this embodiment, the ground planes are above and below the signal line and separated from the signal line by portions of the dielectric layer 40 and the first and second passivation layers 26 and 28.

Figure 15A:
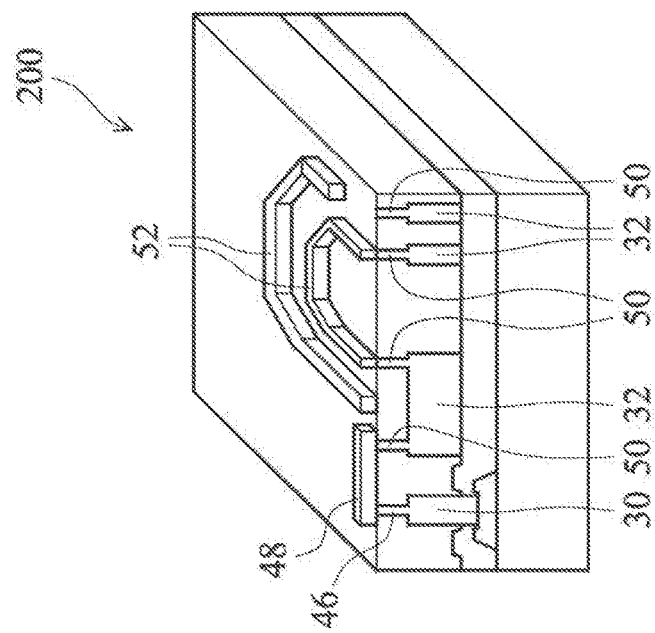
Figure 15B:
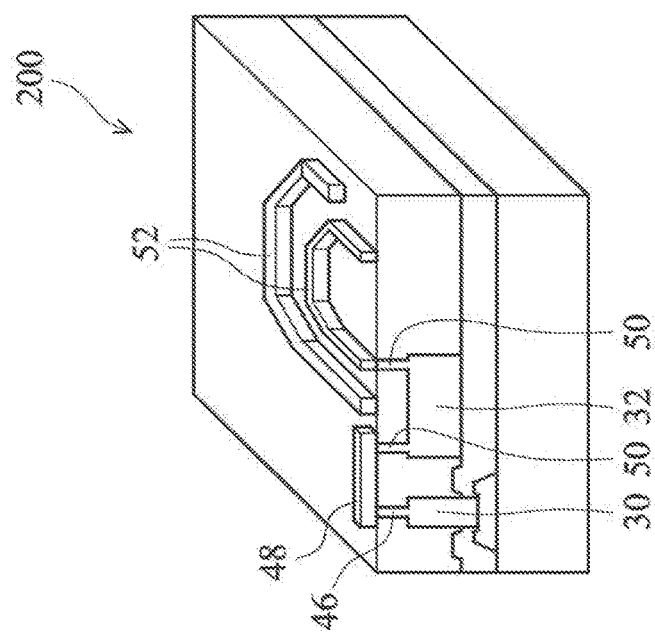

FIGS. 15A and 15B illustrate perspective views of an IPD 200, which are transformers or baluns, according to embodiments. In FIG. 15A, one or more PPI features 52 may act as the coils of the transformer or balun with the metal pillar RDL 32 interconnecting an inner coil and the PPI 48. In FIG. 15B, the coils may each include a lower portion 32, a middle portion 50, and an upper portion 52 which are stacked to form a thick line. The stacking of 32, 50, and 52 may reduce the resistance of the lines and, thus, may improve the performance of the transformer or balun in FIG. 15B.

By using the metal pillar RDL 32 to form the IPDs 200, the package areas are used more efficiently and the performance of the IPDs 200 may be improved. The formation of the exemplary IPDs 200 does not require additional masks and lithography steps. Further, the utilization of the metal pillar RDL 32 may allow for new routing options within the package 300, and the metal pillar RDL 32 may allow for shielding for IPDs 200 or dummy metal patterns below IPDs 200.

An embodiment is a device comprising a substrate, a metal pad over the substrate, and a passivation layer comprising a portion over the metal pad. The device further comprises a metal pillar over and electrically coupled to the metal pad, and a passive device comprising a first portion at a same level as the metal pillar, wherein the first portion of the passive device is formed of a same material as the metal pillar.

Another embodiment is device comprising a die. The die comprises a semiconductor substrate, a metal pad over the semiconductor substrate, a passivation layer comprising a portion over the metal pad, and a metal pillar over the metal pad and extending into the passivation layer. The device further comprises a molding compound encircling the die, a dielectric layer over the metal pillar, the passivation layer, and the molding compound. A post-passivation interconnect (PPI) line over the dielectric layer and electrically coupled to the metal pad through the metal pillar and a via in the dielectric layer, and a passive device comprising a first portion in the passivation layer and a second portion over the dielectric layer.

Yet another embodiment is a method of forming a semiconductor package comprising forming a die, attaching the die over a carrier, and molding the die with a polymer, wherein the polymer encircles the die. The forming of the die comprise forming a metal pad over a semiconductor substrate, forming a passivation layer over the metal pad and the semiconductor substrate, forming a metal pillar over and electrically coupled to the metal pad, and at a same time as the forming the metal pillar, forming a first portion of a passive device.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a conductive pad over a substrate;
   a passivation layer over the substrate;
   a conductive pillar over and electrically coupled to the conductive pad, the conductive pillar being in and physically contacting the passivation layer;
   a molding compound surrounding the substrate and the passivation layer; and
   a passive device comprising a first portion in and physically contacting the passivation layer, and a second portion overlying the molding compound, a surface of the molding compound being level with top surfaces of the conductive pillar and the first portion of the passive device;
   a dielectric layer over and physically contacting the conductive pillar, the first portion of the passive device, the passivation layer, and the molding compound;
   a conductive interconnect over and physically contacting the dielectric layer, the conductive interconnect being electrically coupled to the conductive pillar; and
   a first via in the dielectric layer, the first via electrically coupling the conductive interconnect and the conductive pillar.

2. The structure of claim 1, wherein a material composition of the first portion of the passive device is the same as the conductive pillar.

3. The structure of claim 1, wherein the passive device is selected from a group consisting essentially of a resistor, a capacitor, an inductor, a transformer, a co-planar waveguide, a strip-line, or a combination thereof.

4. The structure of claim 1, wherein the passive device further comprises a third portion over the dielectric layer, the third portion of the passive device having a same material composition as the conductive interconnect.

5. The structure of claim 4, wherein a third portion of the passive device overlies both the substrate and the molding compound.

6. The structure of claim 1, wherein the passivation layer comprises a first passivation layer and a second passivation layer, the conductive pillar extending through both the first and second passivation layers, and the first portion of the passive device extending through the second passivation layer and being over the first passivation layer.

7. A device comprising:
   a metal pad over a substrate;
   a first passivation layer over the substrate;
   a second passivation layer over the first passivation layer;
   a molding compound surrounding and physically contacting the substrate, the first passivation layer, and the second passivation layer;
   a metal pillar over and electrically coupled to the metal pad, the metal pillar extending through the first and second passivation layers; and
   a passive device comprising a first portion and a second portion, the first portion being over the first passivation layer and in the second passivation layer, the second portion being over the first portion, the first portion of the passive device having a same material composition as the metal pillar, top surfaces of the metal pillar, the first portion of the passive device, and the second passivation layer being level with each other.

8. The device of claim 7, wherein the passive device is selected from a group consisting essentially of a resistor, a capacitor, an inductor, a transformer, a co-planar waveguide, a strip-line, or a combination thereof.

9. The device of claim 7, wherein the passive device comprises a second portion over and aligned to the molding compound.

10. The device of claim 7, wherein the molding compound comprises a polymer.

11. The device of claim 7, wherein top surfaces of the metal pillar, the first portion of the passive device, the second passivation layer, and the molding compound are level with each other.

12. The device of claim 7, wherein the first portion of the passive device comprises a barrier layer and a copper layer over the barrier layer.

13. A structure comprising:
    a die comprising:
       a semiconductor substrate;
       a conductive pad over the semiconductor substrate;
       a passivation layer over the semiconductor substrate and partially over the conductive pad; and
       a conductive pillar over and electrically coupled to the conductive pad, the conductive pillar being in and physically contacting the passivation layer;
    an encapsulant laterally surrounding the die;
    a dielectric layer over and physically contacting the conductive pillar, the passivation layer, and the encapsulant;
    a post-passivation interconnect (PPI) line over the dielectric layer and electrically coupled to the conductive pad through the conductive pillar and a via in the dielectric layer; and
    a passive device comprising a first portion in the passivation layer, and a second portion over the dielectric layer.

14. The structure of claim 13, wherein the second portion of the passive device comprises a portion over and aligned to the encapsulant.

15. The structure of claim 13, wherein the passive device is selected from a group consisting of a resistor, a capacitor, an inductor, a transformer, a co-planar waveguide, a strip-line, or a combination thereof.

16. The structure of claim 13, wherein a bottom surface of the encapsulant is level with a bottom surface of the semiconductor substrate, and wherein a top surface of the encapsulant is level with top surfaces of the passivation layer and the conductive pillar.

17. The structure of claim 13, wherein the first portion of the passive device is formed of a same material as the conductive pillar.

18. The structure of claim 13, wherein outermost sidewalls of the passivation layer are coterminous with outermost sidewalls of the semiconductor substrate.

19. The device of claim 7 further comprising:
a dielectric layer over and physically contacting the metal pillar, the first portion of the passive device, the second passivation layer, and the molding compound.

* * * * *